United States Patent
Adachi et al.

(10) Patent No.: US 11,584,687 B2
(45) Date of Patent: Feb. 21, 2023

(54) SURFACE-TREATED GLASS CLOTH

(71) Applicant: NITTO BOSEKI CO., LTD., Fukushima (JP)

(72) Inventors: Kazutaka Adachi, Fukushima (JP); Kohei Matsumoto, Fukushima (JP); Hiromitsu Miyagi, Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 0 days.

(21) Appl. No.: 17/639,746

(22) PCT Filed: Aug. 24, 2020

(86) PCT No.: PCT/JP2020/031782
§ 371 (c)(1),
(2) Date: Mar. 2, 2022

(87) PCT Pub. No.: WO2021/131154
PCT Pub. Date: Jul. 1, 2021

(65) Prior Publication Data
US 2022/0267204 A1 Aug. 25, 2022

(30) Foreign Application Priority Data

Dec. 26, 2019 (JP) .............................. JP2019-235698

(51) Int. Cl.
| C03C 25/40 | (2006.01) |
| C03C 25/25 | (2018.01) |
| C08J 5/24 | (2006.01) |
| H05K 1/03 | (2006.01) |

(52) U.S. Cl.
CPC .............. *C03C 25/40* (2013.01); *C03C 25/25* (2018.01); *C08J 5/24* (2013.01); *H05K 1/0366* (2013.01); *C03C 2203/50* (2013.01)

(58) Field of Classification Search
CPC ..... C03C 25/25; C03C 25/40; C03C 2203/50; C08J 5/24; H05K 1/0366
See application file for complete search history.

(56) References Cited

U.S. PATENT DOCUMENTS 3,734,763 A * 5/1973 Plueddemann ....... C07F 7/1804
556/424

FOREIGN PATENT DOCUMENTS

| JP | H04-370275 A | 12/1992 |
| JP | 2005-281889 A | 10/2005 |
| JP | 2015-078079 A | 4/2015 |
| JP | 2016-094674 A | 5/2016 |
| JP | 2019-073814 A | 5/2019 |
| JP | 2020-158945 A | 10/2020 |

OTHER PUBLICATIONS

Hawley's Condensed Chemical Dictionary, entry for Quaternary Ammonium Salt (2007).*

* cited by examiner

*Primary Examiner* — Kregg T Brooks
(74) *Attorney, Agent, or Firm* — Carrier Shende & Associates, P.C.; Joseph P. Carrier; Fulchand P. Shende

(57) ABSTRACT

The surface-treated glass cloth includes a surface treatment layer on a surface, and the surface treatment layer includes: a first silane coupling agent containing at least one amine selected from the group consisting of a primary amine, a secondary amine and a tertiary amine and containing no quaternary ammonium cation; a second silane coupling agent containing at least one quaternary ammonium cation; an organic acid; and a surfactant. A total content of the first silane coupling agent and the second silane coupling agent is 0.05 to 1.20 mass% based on the total amount of the surface-treated glass cloth, a ratio of a molar content of the first silane coupling agent to a molar content of the second silane coupling agent is 1.1 to 10.0, and a content of the organic acid is 50 to 300 ppm based on the total amount of the surface-treated glass cloth.

5 Claims, No Drawings

SURFACE-TREATED GLASS CLOTH

TECHNICAL FIELD

The present invention relates to a surface-treated glass cloth.

BACKGROUND ART

As a base material of a printed wiring board, for example, a copper-clad laminate obtained by laminating a plurality of prepregs, each of which is obtained by impregnating a surface-treated glass cloth with a matrix resin such as an epoxy resin varnish and dying the glass cloth, and arranging a copper foil as its outer layer is used. In order to enhance affinity of the glass cloth that is an inorganic substance for the matrix resin that is an organic substance, the surface-treated glass cloth is one having been generally surface-treated with a compound having reactivity to both the glass and the matrix resin, namely, a so-called silane coupling agent.

By the way, the surface-treated glass cloth has a problem that if interfacial peeling occurs at the interface between the glass and the matrix resin when the glass cloth is used to prepare the prepreg, insulation reliability is reduced. Then, in order to solve the above problem of the surface-treated glass cloth, known is a surface-treated glass cloth having been subjected to surface treatment with a silane coupling agent a plurality of times, wherein a silane coupling agent having high affinity for the glass cloth and exhibiting low hydrophobicity after the surface treatment is used in the first treatment and a silane coupling agent exhibiting high hydrophobicity after the surface treatment is used in the second and subsequent treatment (see, for example, Patent Literature 1).

It is thought that according to the surface-treated glass cloth of Patent Literature 1, the silane coupling agent of the first treatment has high affinity for the glass, and the silane coupling agent of the second treatment has high affinity for the matrix resin, so that interfacial peeling at the interface between the glass and the matrix resin is prevented, and the insulation reliability can be enhanced.
Citation List
Patent Literature
  Patent Literature 1: Japanese Patent Laid-Open No. 4-370275

SUMMARY OF INVENTION

Technical Problem

However, the surface-treated glass cloth of Patent Literature 1 has disadvantages that since the surface treatment with a silane coupling agent is carried out a plurality of times, the operation is complicated, and the productivity is decreased.

It is an object of the present invention to eliminate such disadvantages and to provide a surface-treated glass cloth having excellent insulation reliability when used to prepare a printed wiring board, and having high productivity.
Solution to Problem In order to achieve the above object, the surface-treated glass cloth of the present invention is a surface-treated glass cloth comprising a surface treatment layer on a surface, wherein the surface treatment layer comprises: a first silane coupling agent containing at least one amine selected from the group consisting of a primary amine, a secondary amine and a tertiary amine and containing no quaternary ammonium cation; a second silane coupling agent containing at least one quaternary ammonium cation; an organic acid; and a surfactant, a total content of the first silane coupling agent and the second silane coupling agent is in the range of 0.05 to 1.20 mass% based on the total amount of the surface-treated glass cloth, a ratio of a molar content of the first silane coupling agent to a molar content of the second silane coupling agent (molar content of first silane coupling agent/ molar content of second silane coupling agent) is in the range of 1.1 to 10.0, and a content of the organic acid is in the range of 50 to 300 ppm based on the total amount of the surface-treated glass cloth.

Since the surface-treated glass cloth of the present invention has the above constitution, occurrence of interfacial peeling at the interface between the glass and the matrix resin can be prevented and excellent insulation reliability can be obtained when the glass cloth is used to prepare a prepreg. Moreover, the surface-treated glass cloth of the present invention can be obtained by one-time surface treatment using a treatment solution containing the first silane coupling agent, the second silane coupling agent, an organic acid and a surfactant, and does not need a plurality of times of surface treatment with different silane coupling agents, so that high productivity can be obtained.

In the surface-treated glass cloth of the present invention, a sticking ratio of the surface treatment layer is preferably 50.0% or more, and when the glass cloth is used to prepare a printed wiring board, more excellent insulation reliability can be obtained.

In the surface-treated glass cloth of the present invention, for example, acetic acid can be used as the organic acid.

The present invention also exists in a prepreg and/or a printed wiring board each comprising the surface-treated glass cloth of the present invention.

DESCRIPTION OF EMBODIMENTS

Next, embodiments of the present invention will be described in more detail.

The surface-treated glass cloth of the present embodiment comprises a surface treatment layer on a surface, and the surface treatment layer comprises: a first silane coupling agent containing at least one amine selected from the group consisting of a primary amine, a secondary amine and a tertiary amine and containing no quaternary ammonium cation; a second silane coupling agent containing at least one quaternary ammonium cation; an organic acid; and a surfactant.

In the surface-treated glass cloth of the present embodiment, the total content of the first silane coupling agent and the second silane coupling agent in the surface treatment layer is in the range of 0.05 to 1.20 mass% based on the total amount of the surface-treated glass cloth, a ratio of a molar content of the first silane coupling agent to a molar content of the second silane coupling agent (molar content of first silane coupling agent/molar content of second silane coupling agent) is in the range of 1.1 to 10.0, and a content of the organic acid is in the range of 50 to 300 ppm based on the total amount of the surface-treated glass cloth.

From the viewpoint of productivity, the surface treatment layer is preferably a single layer. Here, being a single layer means that there is the same component composition from the outermost part of the surface treatment layer to the glass cloth surface part.

In the surface-treated glass cloth of the present embodiment, the total content of the first silane coupling agent and the second silane coupling agent in the surface treatment layer is preferably in the range of 0.26 to 1.10 mass%, more preferably in the range of 0.27 to 0.80 mass%, still more preferably in the range of 0.28 to 0.60 mass%, and particularly preferably in the range of 0.29 to 0.44 mass%, based on the total amount of the surface-treated glass cloth.

Examples of the first silane coupling agents include 3-aminopropyltrimethoxysilane, 3-aminopropyltriethoxysilane, 3-(2-aminoethyl)aminopropyltrimethoxysilane, ureidopropyltrimethoxysilane, ureidopropyltriethoxysilane, N-2-(aminoethyl)-3-aminopropyltrimethoxysilane, and N-2-(aminoethyl)-3-aminopropylmethyldimethoxysilane. The first silane coupling agent is preferably a silane coupling agent containing at least one primary amine because the adhesive strength to the resin is increased.

Example of the second silane coupling agents include N-β-(N-vinylbenzylaminoethyl)-γ-aminopropyltrimethoxysilane hydrochloride, N-2-(aminoethyl) -3-aminopropylmethyldimethoxysilane hydrochloride, N-2-(aminoethyl)-3-aminopropyltrimethoxysilane hydrochloride, 3-aminopropyltrimethoxysialne hydrochloride, 3-aminopropyltriethoxysilane hydrochloride, 3-triethoxysilyl-N-(1,3-dimethyl-butylidene)propylamine hydrochloride, and N-phenyl-3-aminopropyltrimethoxysilane hydrochloride.

In the surface-treated glass cloth of the present embodiment, a ratio of a molar content of the first silane coupling agent to a molar content of the second silane coupling agent (molar content of first silane coupling agent/molar content of second silane coupling agent) is preferably in the range of 1.3 to 5.0, more preferably in the range of 1.4 to 4.0, and still more preferably in the range of 1.5 to 3.0.

Here, the ratio of a molar content of the first silane coupling agent to a molar content of the second silane coupling agent in the surface treatment layer becomes equal to a ratio of a molar content of the first silane coupling agent to a molar content of the second silane coupling agent in the surface treatment agent solution used for surface treatment of a glass cloth. The molar content of the first silane coupling agent and the molar content of the second silane coupling agent in the surface treatment layer can be each obtained by extracting a silane coupling agent with an aqueous or an organic solvent, then carrying out identification of a chemical structure of the silane coupling agent using GC-MS, carrying out determination of a content of the silane coupling agent by contrast with a calibration curve prepared using a standard substance, and calculating the ratio from these.

In the surface-treated glass cloth of the present embodiment, the content of the organic acid in the surface treatment layer is preferably in the range of 150 to 200 ppm, more preferably in the range of 155 to 190 ppm, and still more preferably in the range of 160 to 180 ppm, based on the total amount of the surface-treated glass cloth.

Examples of the organic acids in the surface-treated glass cloth of the present embodiment include acetic acid, formic acid, propionic acid, malonic acid, maleic acid, succinic acid, oxalic acid, malic acid, and citric acid. As the organic acid, acetic acid is preferable because it is excellent in handling properties.

In the surface-treated glass cloth of the present embodiment, any of a nonionic surfactant, an anionic surfactant, a cationic surfactant, and an amphoteric surfactant may be used as the surfactant. The content of the surfactant is, for example, 10 to 50 ppm based on the total amount of the surface-treated glass cloth. Here, the type of the surfactant can be specified by extracting the surfactant with an aqueous or an organic solvent and then using GC-MS or electrophoresis, and the content of the surfactant can be specified by contrast with a calibration curve prepared using a standard substance.

Examples of the nonionic surfactants include glycerol fatty acid ester, sorbitan fatty acid ester, sucrose fatty acid ester, polyoxyethylene alkyl ether, polyoxyethylene alkyl phenyl ether, polyoxyethylene polyoxypropylene glycol, fatty acid polyethylene glycol, fatty acid polyoxyethylene sorbitan, and fatty acid alkanolamide.

Examples of the anionic surfactants include fatty acid monocarboxylate, polyoxyethylene alkyl ether carboxylate, N-acylsarcosine salt, N-acylglutamate, dialkyl sulfosuccinate, alkanesulfonate, alpha olefin sulfonate, linear alkylbenzene sulfonate, alkylbenzene sulfonate, naphthalene sulfonate-formaldehyde condensate, alkylnaphthalene sulfonate, N-methyl-N-acyl taurine salt, alkyl sulfate, polyoxyethylene alkyl ether sulfate, fat and oil-sulfuric ester salt, alkyl phosphate, polyoxyethylene alkyl ether phosphate, and polyoxyethylene alkyl phenyl ether phosphate.

Examples of the cationic surfactants include monoalkylamine salt, dialkylamine salt, trialkylamine salt, alkyltrimethylammonium chloride, and alkylbenzalkonium chloride.

Examples of the amphoteric surfactants include alkylbetaine, fatty acid amidopropyl betaine, 2-alkyl-N-carboxymethyl-N-hydroxyethyl imidazolinium betaine, alkyldiethylenetriaminoacetic acid, and alkylamine oxide.

As the HLB value of the surfactant, a value of 6.0 to 19.0 can be adopted. Here, the HLB value of the surfactant can be calculated based on the chemical structure of the surfactant.

In the surface-treated glass cloth of the present embodiment, the sticking ratio of the surface treatment layer is preferably 50.5 to 80.0%, more preferably 51.0 to 70.0%, and still more preferably 51.5 to 65.0%. The sticking ratio of the surface treatment layer reflects the amount of the silane coupling agent chemically bonded to the surface of the glass cloth, and is affected by the progress level of hydrolysis of the silane coupling agent in the surface treatment agent solution or the stability of the surface treatment agent solution. Here, the organic acid in the surface treatment agent solution accelerates hydrolysis of the silane coupling agent, but on the other hand, it deteriorates stability of the surface treatment agent solution.

The surface-treated glass cloth of the present embodiment can be produced in, for example, the following manner.

First, a glass batch (glass raw material) having been adjusted to have a prescribed glass composition is melted and fiberized to obtain glass filaments.

Examples of the prescribed glass compositions include an E glass composition that is most generic (composition containing 52.0 to 56.0 mass% of $SiO_2$, 12.0 to 16.0 mass% of $Al_2O_3$, 20.0 to 25.0 mass% in total of MgO and CaO, and 5.0 to 10.0 mass% of $B_2O_3$, in terms of an oxide, based on the total amount of glass fibers), a high-strength high-elastic modulus glass composition (composition containing 64.0 to 66.0 mass% of $SiO_2$, 24.0 to 26.0 mass% of $Al_2O_3$, and 9.0 to 11.0 mass% of MgO, based on the total amount of glass fibers), an easily manufacturable high-elastic modulus glass composition (composition containing 57.0 to 60.0 mass% of $SiO_2$, 17.5 to 20.0 mass% of $Al_2O_3$, 8.5 to 12.0 mass% of MgO, 10.0 to 13.0 mass% of CaO, and 0.5 to 1.5 mass% of $B_2O_3$, based on the total amount of glass fibers, total amount of $SiO_2$, $Al_2O_3$, MgO and CaO being 98.0 mass% or more), and a low-dielectric constant low-dielectric dissipation factor glass composition (composition containing 48.0 to 62.0 mass% of $SiO_2$, 17.0 to 26.0 mass% of $B_2O_3$, 9.0 to 18.0 mass% of $Al_2O_3$, 0.1 to 9.0 mass% of CaO, 0 to 6.0 mass% of MgO, 0.05 to 0.5 mass% in total of $Na_2O$, $K_2O$ and $Li_2O$, 0 to 5.0 mass% of $TiO_2$, 0 to 6.0 mass% of SrO, 0 to 3.0 mass% in total of $F_2$ and $Cl_2$, and 0 to 6.0 mass% of $P_2O_5$, based on the total amount of glass fibers). In the use as a substrate of a printed wiring board, the E glass composition or the low-dielectric constant low-dielectric dissipation factor glass composition is preferable.

The filament diameters of the glass filaments are not particularly limited, but for the use as a base material of a printed wiring board, they are each preferably 10 μm or less, more preferably 8 μm or less, and particularly preferably in the range of 3 to 5 μm.

The glass filaments, for example, 25 to 500, preferably 40 to 300 glass filaments, are bundled by a method known per se to prepare a glass fiber yarn. A process including melting a glass batch, fiberizing it to obtain glass filaments and then bundling a plurality of glass filaments to obtain a glass fiber yarn is referred to as fiber forming.

The count of the glass fiber yarn is preferably 0.8 to 135 tex, and more preferably 1 to 25 tex. The count (tex) of the glass fiber yarn corresponds to the mass (g) per 1000 m of a glass fiber.

Next, the glass fiber yarns are woven as warp yarns or weft yarns to obtain a glass cloth. Examples of the methods for weaving include, but are not limited to, plain weave, satin weave and twill weave, and the method is preferably plain weave. The weaving density of the glass fiber yarns in the weaving is not particularly limited, but is preferably, for example, 10 to 150 yarns/25 mm, and more preferably 40 to 100 yarns/25 mm.

In the weaving, a sizing agent is used for bundling of the glass filaments, warping of warp yarns, etc. Examples of the sizing agent include a sizing agent in which the film-forming agent component is a starch-based one or a PVA (polyvinyl alcohol)-based one. The sizing agent may contain an oil, a softener, or the like.

The amount of the sizing agent adhering to the glass cloth is preferably 0.1 to 3 parts by mass, and more preferably 0.5 to 1.5 parts by mass, based on 100 parts by mass of the glass fiber yarns. The range of the amount of the adhering sizing agent or the amount of adhering sizing agent when not particularly specified indicates an average of the amounts of the sizing agents adhering to the warp yarns or the weft yarns.

From the viewpoint of the use of the glass cloth obtained by the above weaving as a base material of a printed wiring board, the mass per unit area of the glass cloth is preferably 110 g/m² or less, and more preferably 50 g/m² or less. On the other hand, from the viewpoint of weaving performance, the mass per unit area of the glass cloth is preferably 8 g/m² or more.

From the viewpoint of the use of the glass cloth obtained by the above weaving as a base material of a printed wiring board, the thickness of the glass cloth is preferably 100 μm or less, and more preferably 50 μm or less. On the other hand, from the viewpoint of weaving performance, the thickness of the glass cloth is preferably 8 μm or more.

Next, the glass cloth is subjected to opening treatment. Examples of the opening treatment include opening by water flow pressure, opening by high frequency oscillation using a liquid as a medium, opening by pressure of a fluid having surface pressure, and opening by application of pressure using a roll. Among the above opening treatment, opening by water flow pressure or opening by high frequency oscillation using a liquid as a medium is preferably used because variation in yarn width of each of the warp yarn and the weft yarn after the opening treatment is reduced. For the opening treatment, a plurality of the treatment methods may be used in combination.

Next, the glass cloth having been subjected to the opening treatment is subjected to desizing treatment. The desizing treatment can be carried out by, for example, arranging the glass cloth in a heating furnace at an ambient temperature of 350 to 450° C. for 40 to 80 hours to thermally decompose the sizing agent for fiber forming and the sizing agent for weaving adhering to the glass cloth.

Next, the glass cloth having been subjected to the desizing treatment is immersed once in a surface treatment agent solution which contains the first silane coupling agent, the second silane coupling agent, the organic acid and the surfactant and in which the ratio of a molar content of the first silane coupling agent to a molar content of the second silane coupling agent is in the range of 1.1 to 10.0. Subsequently, the glass cloth to which the surface treatment agent solution has been given is squeezed to remove extra moisture and then dried by heating at a temperature of 80 to 180° C. for a time of 1 to 30 minute, for example, at 110° C. for 5 minutes, thereby forming a surface treatment layer, and thus, the surface-treated glass cloth of the present embodiment is obtained by one-time surface treatment. In the glass cloth to which the surface treatment agent solution has been given, part of the organic acid adhering to the glass cloth surface volatilizes when the glass cloth is dried by heating.

Examples of the solvents of the surface treatment agent solution include water, ethylene glycol, and ethanol. In the surface treatment agent solution, the total concentration of the first silane coupling agent and the second silane coupling agent is, for example, 0.1 to 10.0 mass%, the concentration of the organic acid is, for example, 0.1 to 50.0 mass%, and the concentration of the surfactant is, for example, 0.1 to 10.0 mass%.

Prior to the desizing treatment, the glass cloth is passed through a silica fine particle adhesion tank containing a dispersion in which silica fine particles having a volume-average particle diameter of 30 to 300 nm have been dispersed in water, and thereby, treatment for allowing silica fine particles to adhere to the glass filaments in the glass cloth can be carried out. The amount of the adhering silica fine particles can be, for example, 0.001 to 1 part by mass based on 100 parts by mass of the glass cloth which has not been subjected to surface treatment After the desizing treatment, the glass cloth can be subjected to the second opening treatment.

The prepreg of the present embodiment comprises the aforesaid surface-treated glass cloth of the present embodiment.

The prepreg of the present embodiment is obtained by impregnating the aforesaid surface-treated glass cloth with a resin by a method known pe se and semi-curing the resin.

In the prepreg of the present embodiment, the resin used for impregnation of the aforesaid surface-treated glass cloth is not particularly limited. Examples of such resins include epoxy resin, phenolic resin, unsaturated polyester resin, melamine resin, modified polyimide resin, polyamide resin, polyimide resin, polybutylene terephthalate resin, polyethylene terephthalate resin, polyphenylene sulfide resin, polyphenylene ether resin, modified polyphenylene ether resin, and fluororesin. Among these, polyphenylene ether resin or modified polyphenylene ether resin can be preferably used because the effect of enhancing insulation reliability due to use of the surface-treated glass cloth of the present embodiment is especially great.

The printed wiring board of the present embodiment comprises the aforesaid surface-treated glass cloth of the present embodiment.

The printed wiring board of the present embodiment can be obtained, for example, by curing the aforesaid prepreg of the present embodiment.

The prepreg or a fiber-reinforced resin molded article comprising the surface-treated glass cloth of the present embodiment can be used for applications such as housings of antennas, radars and electronic devices, in addition to the printed wiring board.

Next, examples of the present invention and comparative examples will be described.

EXAMPLES

[Example 1]

In the present example, first, a low-dielectric constant low-dielectric dissipation factor glass cloth corresponding to 2116 of IPC standard (plain weave glass cloth using, as warp yarns and weft yarns, low-dielectric constant low-dielectric dissipation factor glass fiber yarns of 20.8 tex obtained by bundling low-dielectric constant low-dielectric dissipation factor glass filaments of a filament diameter of 7 μm (glass filaments having the aforesaid low-dielectric constant low-dielectric dissipation factor glass composition), and having a warp yarn weaving density of 60 yarns/25.4 mm, a weft yarn weaving density of 58 yarns/25.4 mm, a mass per unit area of 95 g/m$^2$, and a thickness of 94 μm) was woven, and then a glass cloth in which an organic substance present on the glass cloth surface was removed by heat cleaning was prepared.

Next, using 3-aminopropyltriethoxysilane as a first silane coupling agent and N-β-(N-vinylbenzylaminoethyl)-γ-aminopropyltrimethoxysilane hydrochloride as a second silane coupling agent, a surface treatment agent aqueous solution in which a ratio of a molar content of the first silane coupling agent to a molar content of the second silane coupling agent was 1.7, which contained polyoxyethylene alkyl ether as a surfactant, and which had been adjusted to pH 4.3 with acetic acid as an organic acid was prepared.

Next, the glass cloth was immersed in the surface treatment agent aqueous solution, then squeezed to remove moisture by a mangle, and further dried at 110° C. for 5 minutes, thereby obtaining a surface-treated glass cloth of the present example.

Regarding the surface-treated glass cloth obtained in the present example, the total content of the first silane coupling agent and the second silane coupling agent, the amount of the adhering acid, and the surface treatment layer sticking ratio were calculated in the following manner. The results are set forth in Table 1.

[Total Content of First Dilane Coupling Agent and Second Silane Coupling Agent]

The surface-treated glass cloth was cut out, the amount of a nitrogen component and the amount of a carbon component contained in the surface-treated glass cloth were determined using a total nitrogen and total carbon analyzer (manufactured by Sumika Chemical Analysis Service, Ltd., trade name: SUMIGRAPH NC-TRINITY). The amount obtained by excluding the amount of an adhering acid measured by the method described later from the total amount of carbon contained in the glass cloth was regarded as a total content of the first silane coupling agent and the second silane coupling agent. Since the amount of the adhering surfactant is a trace amount relative to the total content of the first silane coupling agent and the second silane coupling agent, it can be substantially ignored in the relation to the total content of the first silane coupling agent and the second silane coupling agent.

[Amount of Adhering Acid]

The surface-treated glass cloth was cut out and weighed, thereafter, chloroform was added, then cleaning with an ultrasonic bath was carried out, and shaking with a dilute alkaline solution and acid extraction using an ultrasonic bath were carried out. The extraction liquid was subjected to centrifugation, and the aqueous layer portion was used as a sample solution. Subsequently, using an electrophoresis system (manufactured by Agilent Technologies, Inc., trade name: 7100 Capillary Electrophoresis System, buffer solution: organic acid analysis buffer manufactured by Agilent Technologies, Inc.), measurement of the sample solution and a standard solution was carried out, and the amount of the acid in the sample solution was determined by a 1-point calibration curve method. Subsequently, from the mass of the surface-treated glass cloth and the mass of the acid determined, the amount of the acid adhering to the surface-treated glass cloth was calculated.

[Surface Treatment Layer Sticking Ratio]

The surface-treated glass cloth was cut into a size of 100 mm ×100 mm, immersed in toluene for one minute, and dried by heating at 120° C. for 30 minutes to allow the surface treatment agent having been physically adsorbed to drop out, thereby obtaining a toluene-treated glass cloth. Regarding the resulting toluene-treated glass cloth, determination of the total content of the first silane coupling agent and the second silane coupling agent and the amount of the adhering silane coupling agent was carried out by the method described in [Total content of first silane coupling agent and second silane coupling agent], and the surface treatment layer sticking ratio (%) was calculated by (Total content of the first silane coupling agent and the second silane coupling agent in the toluene-treated glass cloth)/ (total content of the first silane coupling agent and the second silane coupling agent in the surface-treated glass cloth)×100.

Next, the surface-treated glass cloth obtained in the present example was immersed in an epoxy resin varnish and dried at 130° C. for 13 minutes to obtain a prepreg in which the epoxy resin was semi-cured. Two of the prepregs obtained were laminated, then cellophane films were laid above and below the prepregs, and by the use of a vacuum hot press, a laminated plate having a plate thickness of about 0.3 mm was obtained. Regarding the laminated plate obtained in the present example, a whitening distance was calculated in the following manner. The result is set forth in Table 1. The whitening distance is a numerical value that becomes an index of insulation reliability, and it is shown that as the whitening distance is decreased, the insulation reliability becomes more excellent.

[Whitening Distance]

The laminated plate was cut into a size of 60 mm ×60 mm, and using a diamond cutter, slits each having a length of 30 mm were made in both the longitudinal and the lateral directions, thereby obtaining a specimen. In a beaker, a 1 mol/L-NaOH aqueous solution prepared was introduced, then the specimen was immersed in the NaOH aqueous solution for 30 hours, and using a digital microscope, distances of whitening occurring due to peeling at the interface between the resin and the glass, at 20 points in each of the warp direction and the weft direction were measured, and an average value was calculated, thereby calculating a whitening distance.

[Example 2]

Next, a surface treatment agent aqueous solution was prepared in exactly the same manner as in Example 1, except that the pH of the aqueous solution was adjusted to pH 3.9 with acetic acid as the organic acid.

Next, a surface-treated glass cloth of the present example and a prepreg were obtained in exactly the same manner as in Example 1, except that the surface treatment agent aqueous solution prepared in the present example was used.

Next, in exactly the same manner as in Example 1, the total content of the first silane coupling agent and the second silane coupling agent, the amount of the adhering acid, and the surface treatment layer sticking ratio in the surface-treated glass cloth obtained in the present example were calculated, and a whitening distance of the prepreg obtained in the present example was calculated. The results are set forth in Table 1.

[Comparative Example 1]

Next, a surface treatment agent aqueous solution was prepared in exactly the same manner as in Example 1, except that the pH of the aqueous solution was adjusted to pH 6.8 with acetic acid as the organic acid.

Next, a surface-treated glass cloth of the present comparative example and a prepreg were obtained in exactly the same manner as in Example 1, except that the surface treatment agent aqueous solution prepared in the present comparative example was used.

Next, in exactly the same manner as in Example 1, the total content of the first silane coupling agent and the second silane coupling agent, the amount of the adhering acid, and the surface treatment layer sticking ratio in the surface-treated glass cloth obtained in the present comparative example were calculated, and a whitening distance of the prepreg obtained in the present comparative example was calculated. The results are set forth in Table 1.

[Comparative Example 2]

Next, a surface treatment agent aqueous solution was prepared in exactly the same manner as in Example 1, except that the surfactant was not contained.

Next, a surface-treated glass cloth of the present comparative example and a prepreg were obtained in exactly the same manner as in Example 1, except that the surface treatment agent aqueous solution prepared in the present comparative example was used.

Next, in exactly the same manner as in Example 1, the total content of the first silane coupling agent and the second silane coupling agent, the amount of the adhering acid, and the surface treatment layer sticking ratio in the surface-treated glass cloth obtained in the present comparative example were calculated, and a whitening distance of the prepreg obtained in the present comparative example was calculated. The results are set forth in Table 1.

[Comparative Example 3]

Next, a surface treatment agent aqueous solution was prepared in exactly the same manner as in Example 1, except that the ratio of a molar content of the first silane coupling agent to a molar content of the second silane coupling agent was changed to 0.5.

Next, a surface-treated glass cloth of the present comparative example and a prepreg were obtained in exactly the same manner as in Example 1, except that the surface treatment agent aqueous solution prepared in the present comparative example was used.

Next, in exactly the same manner as in Example 1, the total content of the first silane coupling agent and the second silane coupling agent, the amount of the adhering acid, and the surface treatment layer sticking ratio in the surface-treated glass cloth obtained in the present comparative example were calculated, and a whitening distance of the prepreg obtained in the present comparative example was calculated. The results are set forth in Table 1.

[Comparative Example 4]

Next, a surface treatment agent aqueous solution was prepared in exactly the same manner as in Example 1, except that the ratio of a molar content of the first silane coupling agent to a molar content of the second silane coupling agent was changed to 19.0.

Next, a surface-treated glass cloth of the present comparative example and a prepreg were obtained in exactly the same manner as in Example 1, except that the surface treatment agent aqueous solution prepared in the present comparative example was used.

Next, in exactly the same manner as in Example 1, the total content of the first silane coupling agent and the second silane coupling agent, the amount of the adhering acid, and the surface treatment layer sticking ratio in the surface-treated glass cloth obtained in the present comparative example were calculated, and a whitening distance of the prepreg obtained in the present comparative example was calculated. The results are set forth in Table 1.

TABLE 1

|  |  | Example 1 | Example 2 | Comparative Example 1 | Comparative Example 2 | Comparative Example 3 | Comparative Example 4 |
| --- | --- | --- | --- | --- | --- | --- | --- |
| pH of treatment solution | | 4.3 | 3.9 | 6.8 | 4.3 | 4.3 | 4.3 |
| Surface-treated glass cloth | Silane coupling agent total content (wt %) | 0.30 | 0.30 | 0.29 | 0.29 | 0.29 | 0.29 |
| | First silane coupling agent (mol)/second silane coupling agent (mol) | 1.7 | 1.7 | 1.7 | 1.7 | 0.5 | 19.0 |
| | Amount of adhering acetic acid (ppm) | 160 | 170 | 0 (undetectable) | 160 | 160 | 160 |
| | Presence or absence of surfactant | present | present | present | absent | present | present |
| | Surface treatment layer sticking ratio (%) | 52.3 | 47.3 | 59.4 | 52.5 | 52.1 | 51.9 |
| Molded article | Whitening distance (μm) | 16 | 27 | 95 | 107 | 86 | 68 |

From Table 1, it is obvious that according to the surface-treated glass cloths of Examples 1 and 2 in each of which the total content of the first silane coupling agent and the second silane coupling agent in the surface treatment layer was in the range of 0.05 to 1.20 mass% based on the total amount of the surface-treated glass cloth, the ratio of a molar content of the first silane coupling agent to a molar content of the second silane coupling agent (molar content of first silane coupling agent/molar content of second silane coupling agent) was in the range of 1.1 to 10.0, and the content of the organic acid was in the range of 50 to 300 ppm based on the total amount of the surface-treated glass cloth, the whitening distance was 50 μm or less when they were each used to prepare a prepreg, and the surface-treated glass cloths had excellent insulation reliability. Moreover, it is obvious that the surface-treated glass cloth having a surface treatment layer sticking ratio of 50.0% or more and having a whitening distance of 25 μm or less when used to prepare a prepreg had more excellent insulation reliability.

On the other hand, it is obvious that according to the surface-treated glass cloth of Comparative Example 1 in which the amount of the adhering organic acid in the surface treatment layer was less than 50 ppm, the surface-treated glass cloth of Comparative Example 2 in which a surfactant was not contained in the surface treatment layer, the surface-treated glass cloth of Comparative Example 3 in which the ratio of a molar content of the first silane coupling agent to a molar content of the second silane coupling agent (molar content of first silane coupling agent/molar content of second silane coupling agent) in the surface treatment layer was less than 1.1, and the surface-treated glass cloth of Comparative Example 4 in which the ratio of a molar content of the first silane coupling agent to a molar content of the second silane coupling agent (molar content of first silane coupling agent/molar content of second silane coupling agent) in the surface treatment layer was more than 10.0, the whitening distance was as large as 68 μm or more when they were each used to prepare a prepreg, and they had low insulation reliability as compared with the surface-treated glass cloths of Examples 1 and 2.

The invention claimed is:

1. A surface-treated glass cloth comprising a surface treatment layer on a surface, wherein:
   the surface treatment layer comprises:
   a first silane coupling agent containing at least one amine selected from a group consisting of 3-aminopropyltrimethoxysilane, 3-aminopropyltriethoxysilane, 3-(2-aminoethyl)aminopropyltrimethoxysilane, ureidopropyltrimethoxysilane, ureidopropyltriethoxysilane, and N-2-(aminoethyl)-3-aminopropylmethyldimethoxysilane;
   a second silane coupling agent containing at least one selected from a group consisting of N-β-(N-vinylbenzylaminoethyl)-γ-aminopropyltrimethoxysilane hydrochloride, N-2-(aminoethyl)-3-aminopropylmethyldimethoxysilane hydrochloride, N-2-(aminoethyl)-3-aminopropyltrimethoxysilane hydrochloride, 3-aminopropyltrimethoxysialne hydrochloride, 3-aminopropyltriethoxysilane hydrochloride, 3-triethoxysilyl-N-(1,3-dimethyl-butylidene)propylamine hydrochloride, and N-phenyl-3-aminopropyltrimethoxysilane hydrochloride;
   an organic acid; and
   a surfactant;
   a total content of the first silane coupling agent and the second silane coupling agent is in a range of 0.05 to 1.20 mass % based on a total amount of the surface-treated glass cloth;
   a ratio of a molar content of the first silane coupling agent to a molar content of the second silane coupling agent (molar content of first silane coupling agent/molar content of second silane coupling agent) is in a range of 1.1 to 10.0; and
   a content of the organic acid is in a range 50 to 300 ppm based on the total amount of the surface-treated glass cloth.

2. The surface-treated glass cloth according to claim 1, wherein a sticking ratio of the surface treatment layer is 50.0% or more.

3. The surface-treated glass cloth according to claim 1, wherein the organic acid is acetic acid.

4. A prepreg comprising the surface-treated glass cloth according to claim 1.

5. A printed wiring board comprising the surface-treated glass cloth according to claim 1.

* * * * *